(12) United States Patent
Hirobe

(10) Patent No.: US 6,525,575 B2
(45) Date of Patent: Feb. 25, 2003

(54) OUTPUT BUFFER CIRCUIT

(75) Inventor: Atsunori Hirobe, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/892,068

(22) Filed: Jun. 25, 2001

(65) Prior Publication Data

US 2002/0021151 A1 Feb. 21, 2002

(30) Foreign Application Priority Data

Jun. 27, 2000 (JP) .......................................... 2000-192958

(51) Int. Cl.[7] .................................................. H03K 3/00
(52) U.S. Cl. ...................................... 327/108; 327/112
(58) Field of Search ................................ 327/108, 109, 327/111, 112; 326/56, 57, 58, 82, 83, 86

(56) References Cited

U.S. PATENT DOCUMENTS 4,488,066 A * 12/1984 Shoji ............................ 326/58
5,057,711 A * 10/1991 Lee et al. ..................... 326/58
5,633,603 A * 5/1997 Lee ............................... 326/83
5,691,655 A * 11/1997 Geisler ......................... 326/86
6,225,824 B1 * 5/2001 Madhu et al. ................ 326/58

* cited by examiner

Primary Examiner—Toan Tran
(74) Attorney, Agent, or Firm—Darryl G. Walker; Bradley T. Sako

(57) ABSTRACT

An output buffer circuit (300) having an output time which may be reduced is provided. The output buffer circuit (300) can include a selector (1), a precharge circuit (2) and a buffer (3). Selector (1) can be responsive to a control signal (SELB) and may provide data on a data signal line (9). Precharge circuit (2) may be responsive to control signal (SELB) and may precharge data signal line (9) to a first potential when control signal is in a disable state. Selector (1) may electrically disconnect data input terminals (4 and 5) from data signal line (9) when control signal (SELB) is in the disable state. Buffer (3) may output a logic value from the data signal line (9) when control signal (SELB) is in an enable state.

15 Claims, 4 Drawing Sheets

OUTPUT BUFFER CIRCUIT

TECHNICAL FIELD

The present invention relates generally to a semiconductor circuit and more particularly to an output buffer circuit used for outputting a signal.

BACKGROUND OF THE INVENTION

A conventional buffer circuit can be controllable by a received control signal in a manner that it is enabled when the control signal is in one logic state and is disabled when the control signal is in another logic state.

One such conventional buffer circuit is illustrated in FIG. 1 and given the general reference character 200. Conventional buffer circuit 200 is a 3-state buffer circuit in that it can output a logic one (first state), a logic zero (second state) or can be placed in a high impedance state (third state). Conventional buffer circuit 200 includes a selector 201 and a buffer 202.

Selector 201 includes transfer gates (203 and 204). Transfer gate 203 consists of N-channel metal-oxide-semiconductor (NMOS) transistor 205, P-channel metal-oxide-semiconductor (PMOS) transistor 206 and inverter 207. Similarly, transfer gate 204 consists of NMOS transistor 208, PMOS transistor 209 and inverter 210.

Selector 201 responds to select signals (SEL1 and SEL2) to output one of data input signals (DATAIN1 or DATAIN2) as data signal DATAIN to buffer 202.

Buffer 202 includes NAND gate 211, PMOS transistor 212, NOR gate 213, inverter, 214, and NMOS transistor 215. Conventional buffer circuit 200 is a complementary MOS (CMOS) circuit that is typical in existing semiconductor devices.

NAND gate 211 receives data signal DATAIN and control signal SELB as inputs. NAND gate 211 provides an output to a gate of PMOS transistor 212. NOR gate 213 receives data signal DATAIN as one input and receives control signal SELB through inverter 214 as another input. NOR gate 213 provides an output to a gate of NMOS transistor 215.

When control signal SELB is at a high logic level (i.e. power supply potential), buffer 202 provides an output signal DATAOUT at output terminal 216 that has the same logic level as data signal DATAIN. However, when control signal SELB is at a low logic level (i.e. ground potential), buffer 202 sets output terminal 216 to a high impedance state.

It is noted that when providing a logic low on output signal DATAOUT, the gate of NMOS transistor 215 must be pulled high by NOR gate 213. Because the load on output signal DATAOUT can be large, NMOS transistor 215 is typically a large device. Thus, NOR gate 213 must pull a relatively large capacitive node to a high level. This can inhibit the speed of operation of the buffer 202, as will be explained in more detail with reference to FIG. 2.

Referring now to FIG. 2, a circuit diagram of NOR gate 213 is set forth. NOR gate 213 is a conventional CMOS NOR gate that is widely used in existing semiconductor devices.

NOR gate 213 consists of PMOS transistors (221 and 222) and NMOS transistors (223 and 224). Input terminal 225 is connected to the gate of PMOS transistor 221 and the gate of NMOS transistor 223. Input terminal 226 is connected to the gate of PMOS transistor 222 and NMOS transistor 224. The source of PMOS transistor 221 is connected to power supply terminal 229. The drain of PMOS transistor 221 is connected to the source of PMOS transistor 222. The drain of PMOS transistor 222 is connected to output terminal 227. NMOS transistors (223 and 224) each have a source connected to ground terminal 228 and a drain connected to output terminal 227. Power supply terminal 229 is fixed to a power supply potential Vcc. Ground terminal 228 is fixed to ground potential.

When output terminal 227 is pulled to a high level, power supply potential is supplied to output terminal 227 through series connected PMOS transistors (221 and 222).

Thus, the gate of NMOS transistor 215 (FIG. 1) is pulled high through two series connected PMOS transistors (221 and 222) in NOR gate 213. Series connected PMOS transistors have only one-half the current drive as a single PMOS transistor of the same size. Also, PMOS transistors have a lower conductivity than NMOS transistors due to the differing mobility between holes and electrons. In order to increase the driving capability of the two series connected PMOS transistors (221 and 222) in NOR gate 213 each PMOS transistor must have a gate width that is double the gate width to get similar driving capabilities as a single PMOS transistor. However, this increases the load on logic gates in the previous stage, which can result in reduced circuit operational speeds. In order to compensate for this, further increases in device sizes in previous logic stages may be needed, which increases overall chip size and increases production costs.

In view of the above discussion, it would be desirable to provide a buffer circuit having a reduced time required for outputting data. It would also be desirable to provide a buffer circuit, which is capable of selectively outputting a plurality of data and having a reduced time required for outputting data.

SUMMARY OF THE INVENTION

According to the present embodiments, an output buffer circuit having an output time, which may be reduced is provided. The output buffer circuit may include a selector, a precharge circuit, and a buffer. The selector may be responsive to a control signal and may provide data on a data signal line. Precharge circuit may be responsive to the control signal and may precharge the data signal line to a first potential when the control signal is in a disable state. The selector may electrically disconnect data input terminals from the data signal line when the control signal is in the disable state. The buffer may output a logic value from the data signal line when the control signal is in an enable state.

According to one aspect of the embodiments, the control signal may have a control signal enable state and a control signal disable state. The selector circuit may be enabled to output a data signal to the data signal line in response to the control signal having the control signal enable state.

According to another aspect of the embodiments, the selector circuit may be disabled to output a data signal to the data signal line in response to the control signal having the control signal disable state.

According to another aspect of the embodiments, a precharge circuit may precharge the data signal line to a first potential when the control signal is in the disable state.

According to another aspect of the embodiments, the first potential may be approximately equal to a power supply potential.

According to another aspect of the embodiments, the selector circuit may be coupled to receive a plurality of data input signals and at least one select signal and may select one of the plurality of data input signals to output on the data signal line according to the at least one select signal.

According to another aspect of the embodiments, the selector circuit may be coupled to receive a single data input signal and may output the single data input signal on the data signal line in response to the control signal.

According to another aspect of the embodiments, the precharge circuit can include a precharge insulated gate field effect transistor (IGFET) providing a low impedance path between a power supply terminal and the data signal line in response to the control signal having the control signal disable state and a high impedance path between the power supply terminal and the data signal line in response to the control signal having the control signal enable state.

According to another aspect of the embodiments, the precharge IGFET may be a p-type IGFET and the power supply terminal may receive a power supply potential that is approximately equal to the first potential.

According to another aspect of the embodiments, the precharge IGFET may be an n-type IGFET and the power supply terminal may receive a power supply potential that is at least one n-type IGFET threshold voltage greater than the first potential.

According to another aspect of the embodiments, a control signal may have a first control signal state and a second control signal state and the buffer may be coupled to receive the data signal form the data signal line and provide a data output signal on a data output terminal based on the value of the data signal when the control signal is in the first control signal state and may provide a buffer disable state on the data output terminal when the control signal is in the second control signal state.

According to another aspect of the embodiments, the buffer circuit may include an n-type driver IGFET having a controllable impedance path coupled between a ground terminal and the data output terminal. The buffer circuit may also include a p-type driver control IGFET having a source connected to a power supply terminal and a drain connected to a control gate of the n-type driver IGFET. The p-type driver IGFET may have a control gate coupled to receive the data signal from the data signal line.

According to another aspect of the embodiments, the buffer can include an inverter having an input coupled to receive the data signal from the data signal line and an output connected to the control gate of the n-type driver IGFET.

According to another aspect of the embodiments, the buffer does not have data carrying signals driven by two series connected p-type IGFETs.

According to another aspect of the embodiments, the buffer disable state can be a high impedance state.

According to another aspect of the embodiments, the buffer disable state can be a first logic state. The first logic state can be a logic high state.

According to another aspect of the embodiments, the selector circuit provides a low impedance path between one of at least one data input terminal and the data signal line when the control signal is in a first control signal state and may provide a high impedance path between all of at least one data input terminals and the data signal line when the control signal has a second control signal state.

According to another aspect of the embodiments, the selector may be coupled to receive a first input terminal and a second input terminal. The selector circuit may include a first pass gate providing a first controllable impedance path between the first input terminal and the data signal line and a second pass gate providing a second controllable impedance path between the second input terminal and the data signal line.

According to another aspect of the embodiments, the selector may include a first selector control circuit coupled to receive the control signal and a first select signal as inputs and may provide a first selector control signal for controlling the first controllable impedance path. The selector may also include a second selector control circuit coupled to receive the control signal and a second select signal as inputs and may provide a second selector control signal for controlling the second controllable impedance path.

According to another aspect of the embodiments, the first select signal may have a first select signal enable state and a first select signal disable state and the second select signal may have a second select signal enable state and a second select signal disable state. The first select signal may be in the first select signal disable state when the second select signal is in the second select signal enable state. The second select signal may be in the second select signal disable state when the first select signal is in the first select signal enable state.

DETAILED DESCRIPTION OF THE EMBODIMENTS

Various embodiments of the present invention will now be described in detail with reference to a number of drawings.

Figure 3:
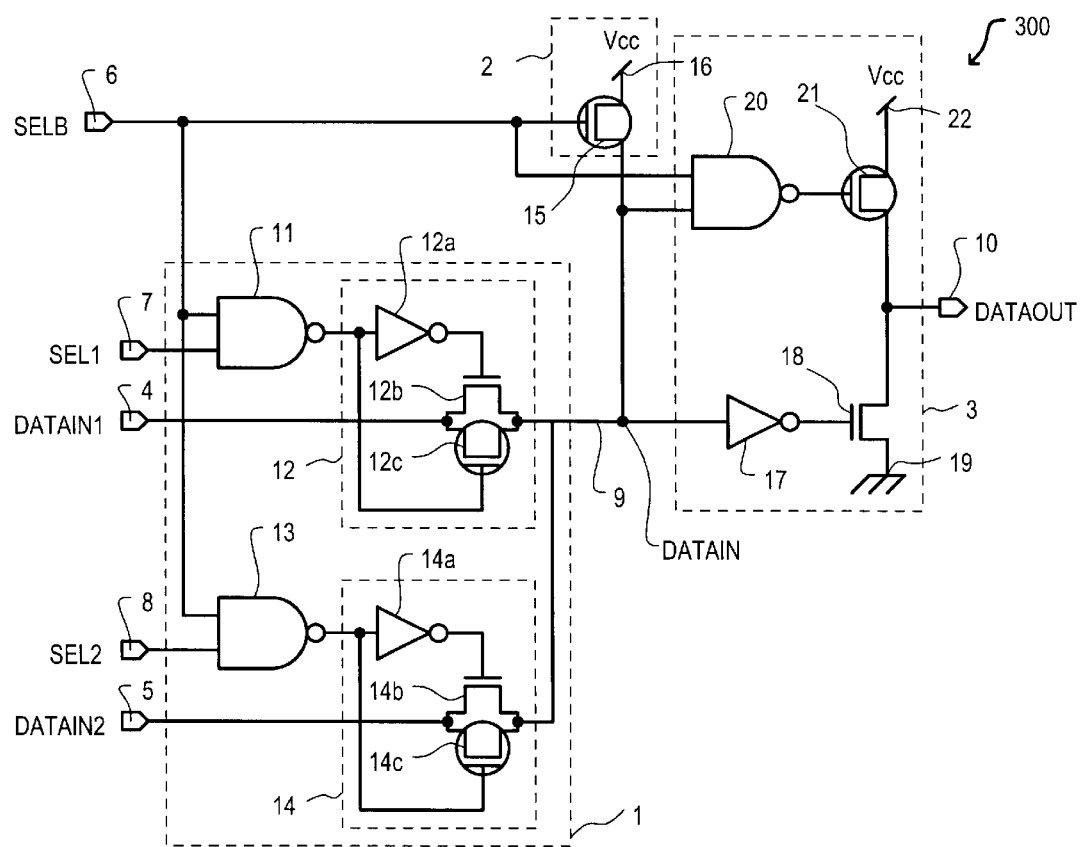
FIG. 3 is a circuit schematic diagram of an output buffer circuit according to one embodiment.

Referring now to FIG. 3, a circuit schematic diagram of an output buffer circuit according to one embodiment is set forth and given the general reference character 300.

Output buffer circuit 300 can include a selector 1, a precharge circuit 2, and a buffer 3.

Selector 1 may receive a control signal SELB from control signal input terminal 6, select signals (SEL1 and SEL2) from select signal input terminals (7 and 8), respectively, and data input signals (DATAIN1 and DATAIN2) from data input terminals (4 and 5). Selector 1 may provide a data signal DATAIN on data signal line 9. Precharge circuit 2 may receive control signal SELB from control signal input terminal 6 and may provide an output to data signal line 9. Buffer circuit may receive control signal SELB from control signal input terminal 6 and data signal DATAIN from data signal line 9 and may provide a data output signal DATAOUT at a data output terminal 10.

Selector 1 may include selector control circuits (11 and 13) and transfer gates (12 and 14). Selector control circuits (11 and 13) may be two input NAND gates, as just one example. Selector control circuit 11 may receive control signal SELB and select signal SEL1 as inputs and may provide an output that may be received by transfer gate 12.

Transfer gate 12 may include an inverter 12a, n-type insulated gate field effect transistor (IGFET) 12b, and p-type IGFET 12c. Inverter 12a may receive an output from selector control circuit 11 as an input and may produce an output that may be received at a control gate of n-type IGFET 12b. P-type IGFET 12c may receive an output from selector control circuit 11 at a control gate. N-type IGFET 12b and p-type IGFET 12c may be connected in parallel to provide a controllable impedance path between data input terminal 4 and data signal line 9.

Transfer gate 14 may include an inverter 14a, n-type insulated gate field effect transistor (IGFET) 14b, and p-type IGFET 14c. Inverter 14a may receive an output from selector control circuit 13 as an input and may produce an output that may be received at a control gate of n-type IGFET 14b. P-type IGFET 14c may receive an output from selector control circuit 13 at a control gate. N-type IGFET 14b and p-type IGFET 14c may be connected in parallel to provide a controllable impedance path between data input terminal 5 and data signal line 9.

Precharge circuit 2 may include a p-type IGFET 15. P-type IGFET 15 may have a control gate connect to receive control signal SELB, a source may be connected to a power supply potential Vcc, and a drain may be connected to data signal line 9. P-type IGFET 15 may provide a controllable impedance path between power supply potential Vcc and data signal line 9.

Buffer 3 may include an inverter 17, n-type IGFET 18, NAND gate 20, and p-type IGFET 21. Inverter 17 may receive data signal from data signal line 9 and may provide an output to a control gate of n-type IGFET 18. N-type IGFET 18 may have a source connected to a ground potential 19 and a source connected to data output terminal 10. NAND gate 20 may receive control signal SELB at one input and data signal DATAIN as another input and may provide an output to a control gate of p-type IGFET 21. P-type IGFET 21 may have a source connected to a power supply potential Vcc and a drain connected to data output terminal 10.

The operation of output buffer circuit 300 will now be described.

When control signal SELB is at a logic low level, precharge circuit 2 may operate to pull data signal line 9 to Vcc through p-type IGFET 15, which may be in a low impedance state. At the same time, selector 1 may receive the logic high control signal SELB. Selector control circuits (11 and 13) may each provide a logic high output to transfer gates (12 and 14). Thus, a logic high signal may be applied to the control gates of p-type IGFETs (12c and 14c) and inverters (12a and 14a) may provide a logic low signal to the control gates of n-type IGFETs (12b and 14b). N-type IGFETs (12b and 14b) and p-type IGFETs (12c and 14c) may be turned off. In this way, data input terminals (4 and 5) may be electrically disconnected from data signal line 9.

With data signal line 9 pulled to a Vcc potential, a low potential may be applied to the control gate of n-type IGFET 18 through inverter 18. With the control gate of n-type IGFET 18 at a low potential, n-type IGFET 18 may be turned off. At the same time, the logic low control signal SELB may be applied to an input of NAND gate 20. Thus, NAND gate 20 may apply a logic high to the control gate of p-type IGFET 21. With the control gate of p-type IGFET 21 at a high potential, p-type IGFET 21 may be turned off. With n-type IGFET 18 and p-type IGFET 21 turned off, data output terminal 10 may be in a high impedance state.

When control signal SELB is logic high, precharge circuit 2 may be disabled and p-type IGFET 15 may be in a high impedance state. Selector 1 may receive the logic high control signal SELB. Selector control circuits (11 and 13) may be enabled and may operate to invert select signals (SEL1 and SEL2), respectively.

If select signal SEL1 is logic high, selector control circuit 11 may provide a logic low output. The logic low output may be received by transfer gate 12. The logic low output may be applied to the control gate of p-type IGFET 12c. With the control gate of p-type IGFET 12c at a logic low, p-type IGFET 12c may be turned on. A logic high signal may be applied to the control gate of n-type IGFET 12c by inverter 12a. With the control gate of n-type IGFET 12b at a logic high, n-type IGFET 12b may be turned on. With n-type IGFET 12b and p-type IGFET 12c turned on, a low impedance path may be provided between data input terminal 4 and data signal line 9. In this way, data signal DATAIN may have the same logic value as data input signal DATAIN1.

If select signal SEL1 is logic low, selector control circuit 11 may provide a logic high output to transfer gate 12. Thus, a logic high signal may be applied to the control gate of p-type IGFET 12c and inverter 12a may provide a logic low signal to the control gate of n-type IGFET 12b. N-type IGFET 12b and p-type IGFET 12c may be turned off (high impedance state). In this way, data input terminal 4 may be electrically disconnected from data signal line 9.

Likewise, if select signal SEL2 is logic high, selector control circuit 13 may provide a logic low output. The logic low output may be received by transfer gate 14. The logic low output may be applied to the control gate of p-type IGFET 14c. With the control gate of p-type IGFET 14c at a logic low, p-type IGFET 14c may be turned on. A logic high signal may be applied to the control gate of n-type IGFET 14c by inverter 14a. With the control gate of n-type IGFET 142b at a logic high, n-type IGFET 14b may be turned on. With n-type IGFET 14b and p-type IGFET 14c turned on, a low impedance path may be provided between data input terminal 5 and data signal line 9. In this way, data signal DATAIN may have the same logic value as data input signal DATAIN2.

If select signal SEL2 is logic low, selector control circuit 13 may provide a logic high output to transfer gate 14. Thus, a logic high signal may be applied to the control gate of p-type IGFET 14c and inverter 14a may provide a logic low signal to the control gate of n-type IGFET 14b. N-type IGFET 14b and p-type IGFET 14c may be turned off (high impedance state). In this way, data input terminal 5 may be electrically disconnected from data signal line 9.

It is noted that select signals (SEL1 and SEL2) may select one of data input signals (DATAIN1 and DATAIN2) to be applied to data signal line 9 through selector 1. Also, it is noted that only one of select signals (SEL1 and SEL2) may be high at any one time. In this way, selector 1 may be conceptualized as a multiplexer for multiplexing between different data input signals (DATAIN1 and DATAIN2).

Data input signal DATAIN may be received by buffer 3. If data input signal DATAIN is a logic high, the output of inverter 17 may be low. Thus, n-type IGFET 18 may receive a low potential at a control gate and may be turned off. NAND gate 20 can receive the logic high control signal SELB at one input and the logic high data input signal at another input. NAND gate 20 may provide a low potential to p-type IGFET 21. Thus, p-type IGFET 21 may be turned on and may provide a low impedance path from power supply terminal 22 to data output terminal 10. In this way, data output signal DATAOUT may be pulled toward the power supply potential Vcc. Thus, data output signal DATAOUT may have the same logic level as data input signal DATAIN, which is logic high.

However, if data signal DATAIN is a logic low, NAND gate 20 can receive the logic high control signal SELB at one input and the logic low data signal DATAIN at another input. NAND gate 20 may provide a high potential to p-type IGFET 21. Thus, p-type IGFET 21 may be turned off and may provide a high impedance path from power supply terminal 22 to data output terminal 10. Inverter 17 may receive the logic low data input signal and may provide a high output. Thus, n-type IGFET 18 may receive a high potential at a control gate and may be turned on and may provide a low impedance path from ground terminal 19 to data output terminal 10. In this way, data output signal DATAOUT may be pulled toward the ground potential. Thus, data output signal DATAOUT may have the same logic level as data signal DATAIN, which is logic low.

It can be seen that when control signal SELB is at logic high, buffer 3 may provide a logic level at a data output terminal 10 that is the same as the logic level received at data signal line 9. However, when control signal SELB is at a logic low, buffer 3 may provide a high impedance state at data output terminal 10.

It can also be noted that when control signal SELB is at a logic low, selector 1 may electrically disconnect data input terminals (4 and 5) from data signal line 9. Also, precharge circuit 2 may precharge data signal line to a power supply potential VCC. However, when control signal SELB is at a logic high, precharge circuit 2 may be disabled and selector 1 may selectively apply either data input signal DATAIN1 or data input signal DATAIN2 to data signal line 9 depending on the logic value of select signals (SEL1 and SEL2). Select signal SEL1 may select data input signal DATAIN1 when active (logic high) and select signal SEL2 may select data input signal DATAIN2 when active (logic high).

Power supply potential Vcc may be a standard operating potential indicative of a logic high potential, as just one example. Power supply potential Vcc may be applied externally to a semiconductor device incorporating output buffer circuit 300. Alternatively, power supply potential Vcc may be an internally generated potential that may be a stepped down potential (lower potential magnitude) from an externally applied power supply or a boosted potential (higher potential magnitude) of an externally applied power potential, as just two examples.

Ground potential may be used as a logic low potential, as just one example.

Figure 1:
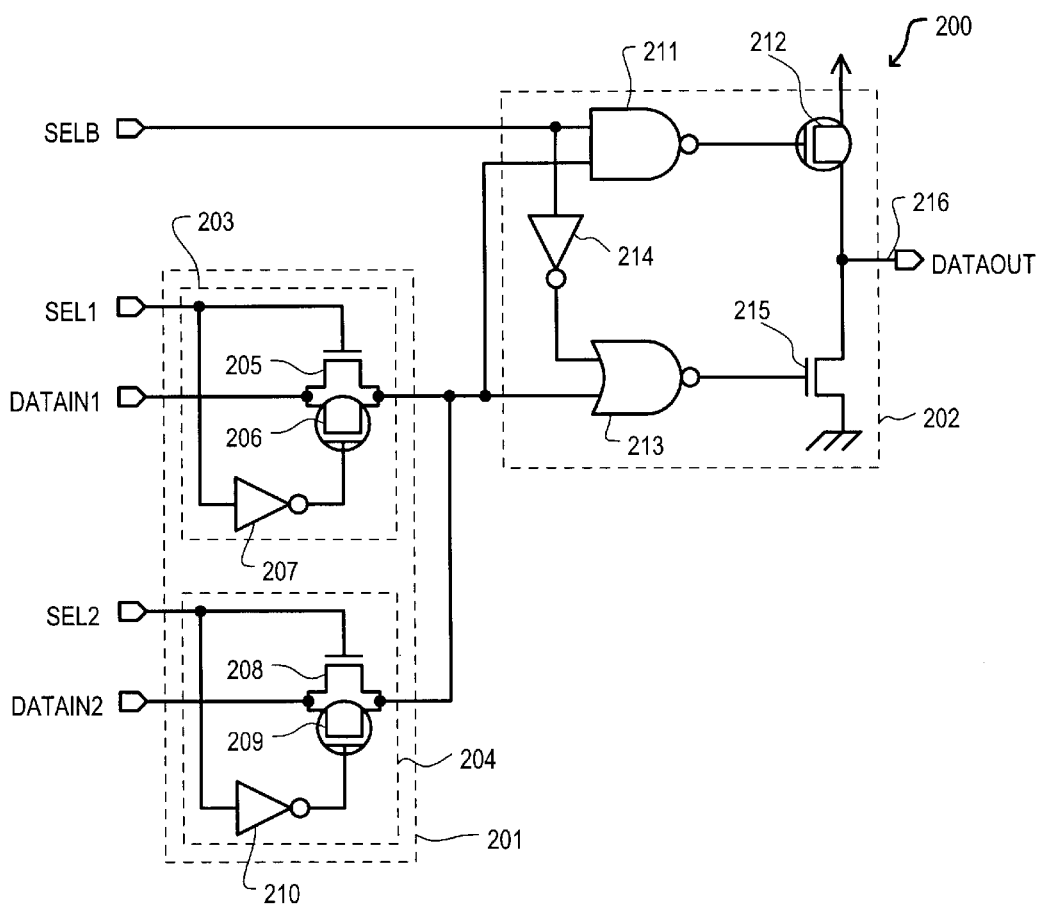
FIG. 1 is a circuit schematic diagram of a conventional output buffer circuit.
Figure 2:
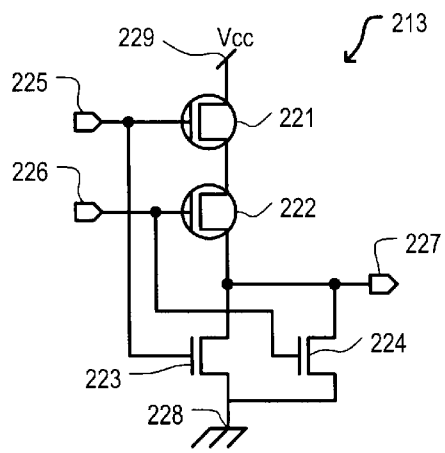
FIG. 2 is a circuit schematic diagram of a conventional NOR logic gate.

It should be noticed that the control gate of n-type IGFET 18 may be driven by an inverter 17. Inverter 17 may have a faster pull-up time than NOR gate 213 illustrated in conventional output buffer circuit 200 of FIG. 1. Inverter 17 may receive data signal line 9. Data signal line 9 may be used as a signal line through which data input signal DATAIN is supplied to buffer 3. However, data signal line 9 may also contain information from select signal SELB by way of precharge circuit 2. In this way, data signal line 9 may operate to provide data when select signal SELB is in a buffer enable state (logic high), but may provide a disable signal through precharge circuit 2, when select signal SELB is in a buffer disable state (logic low). Data signal line 9 may serve to turn off n-type IGFET 19 when select signal SELB is in a buffer disable state.

In this way, by eliminating the two input logic gate (NOR 213) of conventional output buffer circuit 200 (FIG. 1), by using a single input logic gate (inverter 17), the operation of output buffer circuit 300 may have an increased operating speed.

Figure 4:
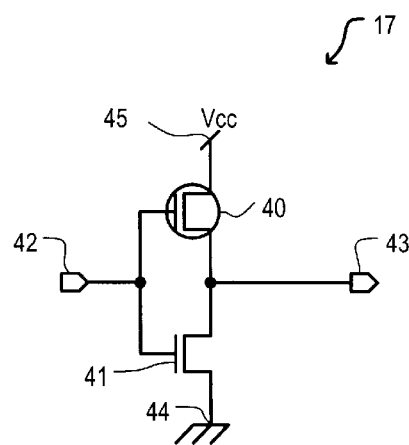
FIG. 4 is a circuit schematic diagram of an inverter according to one embodiment.

Referring now to FIG. 4, a circuit schematic diagram of inverter 17 according to an embodiment is set forth. Inverter 17 may be a CMOS inverter as is widely used in semiconductor devices. Inverter 17 may be used as inverter 17 in output buffer circuit 300 illustrated in FIG. 3.

Inverter 17 may include a p-type IGFET 40 and an n-type IGFET 41. P-type IGFET may have a control gate connected to an input terminal 42, a source connected to power supply terminal 45, and a drain connected to output terminal 43. Power supply terminal may be connected to the power supply potential Vcc. N-type IGFET 41 may have a control gate connected to input terminal 42, a source connected to ground terminal 44, and a drain connected to output terminal 43. Ground terminal 44 may be fixed to ground potential.

Referring to FIG. 3 in conjunction with FIG. 4, input terminal 42 may be connected with data signal line 9. Output terminal 43 may be connected with a control gate of n-type IGFET 18.

When output terminal 43 (i.e. the control gate of n-type IGFET 18) is pulled high, it may be connected to power supply potential through a single p-type IGFET 40. Accordingly, inverter 17 may drive the gate of n-type IGFET 18 high at a higher speed than the case where the gate is driven by a NOR gate as in the conventional approach. The increased speed can make the embodiment illustrated in FIG. 3 more preferable than the conventional approach.

In an initial state, control signal SELB may be at a logic low. As described previously, data output terminal 10 may be in a high impedance state. Also, data signal line 9 may be precharged to a high level through precharge circuit 2.

One of data input signals (DATAIN1 and DATAIN2) may then be selected by select signals (SEL1 and SEL2), respectively. When data input signal DATAIN1 is to be outputted as data output signal DATAOUT, select signal SEL1 may be brought to a high logic level. When data input signal DATAIN2 is to be outputted as data output signal DATAOUT, select signal SEL2 may be brought to a high logic level.

When control signal SELB is brought to a high logic level, precharge circuit 2 may be disabled and data may be selectively applied to data signal line 9 by way of selector 1 according to the logic levels of select signals (SEL1 and SEL2). As a result, one of data input signals (DATAIN1 and DATAIN2) may be output onto data signal line 9. Thus, data signal DATAIN can be generated.

It is noted that control signal SELB may be applied to selector 1 to disconnect data input terminals (4 and 5) from data signal line 9 when select signal SELB is logic low and precharge circuit 2 is enabled.

Also, by precharging data signal line 9 to a high potential, the potential level of data signal line 9 may only change when outputting a logic zero data signal. Thus, in the data speed path, data signal line may only make a high to low transition. This may reduce the time required for outputting data output signal DATAOUT because data signal line 9 may be pulled low faster than it can be pulled high. This is due to the mobility difference between n-type IGFETs and p-type IGFETs.

Although selector 1 may select one of two data input signals (DATAIN1 or DATAIN2), it may also be possible to set the number of selectable input signals to more than two. In that case, more than two select signals (SEL1 and SEL2) may be provided or select signals (SEL1 and SEL2) may be used as providing up to four binary combinations.

Figure 5:
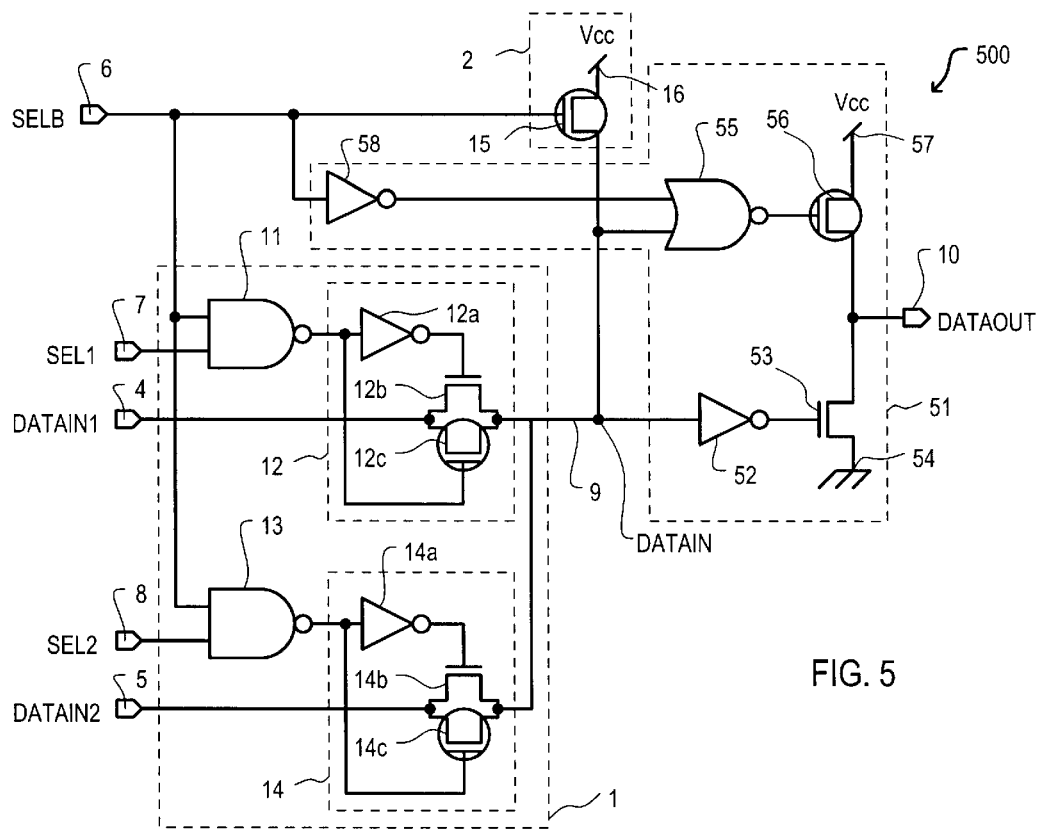
FIG. 5 is a circuit schematic diagram of an output buffer circuit according to one embodiment.

Referring now to FIG. 5, a circuit diagram of an output buffer circuit according to another embodiment is set forth and given the general reference character 500.

Output buffer circuit 500 can include similar circuit elements as output buffer circuit 300 (FIG. 3), as such, these similar circuit elements may be indicated by the same reference character.

Output buffer circuit 500 may operate in a similar manner to output buffer circuit 300. However, when neither of data input signals (DATAIN1 and DATAIN2) are being output, data output terminal 10 may be driven to a high logic level as opposed to placed in a high impedance state.

Output buffer circuit 500 can include a selector 1, a precharge circuit 2, and a buffer 51.

Selector 1 may have the same construction as selector 1 illustrated in output buffer circuit 300 of FIG. 3. When control signal SELB is logic high, selector 1 may output one of data inputs signals (DATAIN1 and DATAIN2) to buffer 51 through data signal line 9. Select signals (SEL1 and SEL2) may designate which data input signal (DATAIN1 and DATAIN2) is output. When control signal SELB as at a logic low, data input signals (DATAIN1 and DATAIN2) may be electrically disconnected from data signal line 9.

Precharge circuit 2 may have the same construction as precharge circuit 2 illustrated in output buffer circuit 300 of FIG. 3. When control signal SELB is logic low, precharge circuit 2 may precharge data signal line 9 to a high level (approximately power supply potential Vcc). By precharging data signal line 9 to a high level, the operating speed of output buffer circuit 500 may be improved.

When control signal SELB is at a high logic level, buffer 51 may provide a logic level at a data output terminal 10 that is the same as the logic level received at data signal line 9. However, when control signal SELB is at a logic low, buffer 51 may provide a high logic level at data output terminal 10.

Buffer 51 may include inverters (52 and 58), n-type IGFET 53, NOR gate 55, and p-type IGFET 56. Inverter 52 may receive data signal from data signal line 9 and may provide an output to a control gate of n-type IGFET 53. N-type IGFET 53 may have a source connected to a ground potential and a drain connected to data output terminal 10. NOR gate 55 may receive control signal SELB at one input (through inverter 58) and data signal DATAIN as another input and may provide an output to a control gate of p-type IGFET 56. P-type IGFET 56 may have a source connected to a power supply potential Vcc and a drain connected to data output terminal 10.

The operation of buffer 51 will now be described.

When control signal SELB is at a logic low level, precharge circuit 2 may operate to pull data signal line 9 to Vcc through p-type IGFET 15, which may be in a low impedance state. With data signal line 9 pulled to a Vcc potential, a low potential may be applied to the control gate of n-type IGFET 53 through inverter 52. With the control gate of n-type IGFET 53 at a low potential, n-type IGFET 53 may be turned off. At the same time, the logic high data signal line 9 may be applied to an input of NOR gate 55. With a logic high input, NOR gate 55 may provide a logic low output to the control gate of p-type IGFET 56. Thus, p-type IGFET 56 may be turned on and may provide a low impedance path between power supply terminal 57 and data output terminal 56. In this way, data output signal DATAOUT may become pulled toward the power supply potential Vcc and may become a logic high level.

However, when control signal SELB is logic high, precharge circuit 2 may be disabled and p-type IGFET 15 may be in a high impedance state. Select signals (SEL1 and SEL2) may select one of data input signals (DATAIN1 and DATAIN2) to be applied to data signal line 9 through selector 1. Data input signal DATAIN may be received by buffer 51 by way of data signal line 9.

If data input signal DATAIN is a logic high, the output of inverter 52 may be low. Thus, n-type IGFET 53 may receive a low potential at a control gate and may be turned off. Inverter 58 may receive the logic high control signal SELB and may provide a logic low output to an input of NOR gate 55. NOR gate 55 can also receive the logic high data input signal at another input. NOR gate 55 may provide a low potential to p-type IGFET 56. Thus, p-type IGFET 21 may be turned on and may provide a low impedance path from power supply terminal 22 to data output terminal 10. In this way, data output signal DATAOUT may be pulled toward the power supply potential Vcc. Thus, data output signal DATAOUT may have the same logic level as data input signal DATAIN, which is logic high.

However, if data signal DATAIN is a logic low, NOR gate 55 can receive the logic low output from inverter 58 at one input and the logic low data signal DATAIN at another input. NOR gate 55 may provide a high potential to p-type IGFET 56. Thus, p-type IGFET 56 may be turned off and may provide a high impedance path from power supply terminal 57 to data output terminal 10. Inverter 52 may receive the logic low data input signal and may provide a high output. Thus, n-type IGFET 53 may receive a high potential at a control gate and may be turned on and may provide a low impedance path from ground terminal 54 to data output terminal 10. In this way, data output signal DATAOUT may be pulled toward the ground potential. Thus, data output signal DATAOUT may have the same logic level as data signal DATAIN, which is logic low.

It can be seen that when control signal SELB is at logic high, buffer 51 may provide a logic level at a data output terminal 10 that is the same as the logic level received at data signal line 9. However, when control signal SELB is at a logic low, buffer 3 may provide a high logic level at data output terminal 10.

It should be noticed that the control gate of n-type IGFET 54 may be driven by an inverter 52. Inverter 52 may have a faster pull-up time than NOR gate 213 illustrated in conventional output buffer circuit 200 of FIG. 1. Inverter 52 may receive data signal line 9. Data signal line 9 may be used as a signal line through which data input signal DATAIN is supplied to buffer 51. However, data signal line 9 may also contain information from select signal SELB by way of precharge circuit 2. In this way, data signal line 9 may operate to provide data when select signal SELB is in a buffer enable state (logic high), but may provide a disable signal through precharge circuit 2, when select signal SELB is in a buffer disable state (logic low). Data signal line 9 may serve to turn off n-type IGFET 53 when select signal SELB is in a buffer disable state.

In this way, by eliminating the two input logic gate (NOR 213) of conventional output buffer circuit 200 (FIG. 1), by using a single input logic gate (inverter 17), the operation of output buffer circuit 500 may have an increased operating speed.

Figure 6:
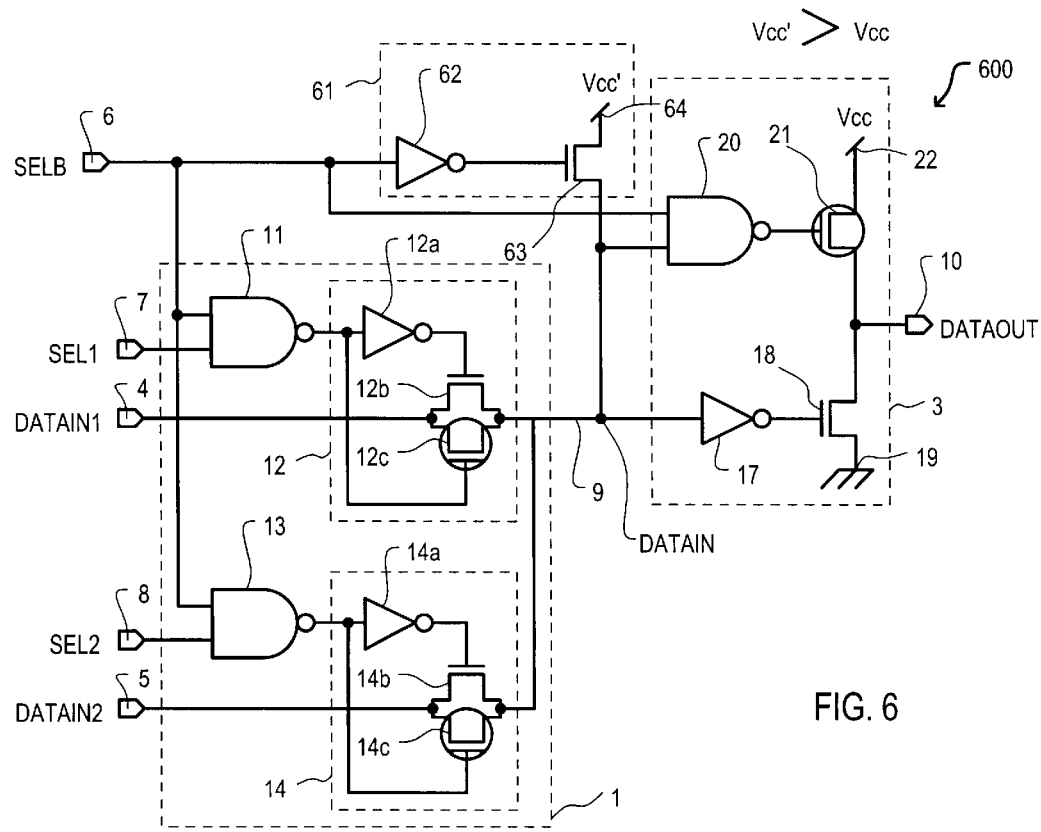
FIG. 6 is a circuit schematic diagram of an output buffer circuit according to one embodiment.

Referring now to FIG. 6, a circuit diagram of an output buffer circuit according to another embodiment is set forth and given the general reference character 600.

Output buffer circuit 600 can include similar circuit elements as output buffer circuit 300 (FIG. 3), as such, these similar circuit elements may be indicated by the same reference character.

Output buffer circuit 600 may include a precharge circuit 61 that is different than the precharge circuit 2 illustrated in the embodiment of FIG. 3.

Output buffer circuit 600 can include a selector 1, a precharge circuit 61, and a buffer 3.

Selector 1 may have the same construction as selector 1 illustrated in output buffer circuit 300 of FIG. 3. When control signal SELB is logic high, selector 1 may output one of data inputs signals (DATAIN1 and DATAIN2) to buffer 3 through data signal line 9. Select signals (SEL1 and SEL2) may designate which data input signal (DATAIN1 and DATAIN2) is output. When control signal SELB as at a logic low, data input signals (DATAIN1 and DATAIN2) may be electrically disconnected from data signal line 9.

Precharge circuit 61 may include an inverter 62 and an n-type IGFET 63. Inverter 62 may have an input connected to receive control signal SELB and an output connected to a control gate of n-type IGFET 63. N-type IGFET 63 may have a drain connected to a power supply terminal 64 and a source connected to data signal line 9. Power supply terminal 64 may be fixed to a raised potential Vcc', which may be higher than power supply Vcc by approximately a threshold voltage $V_T$ of n-type IGFET 63. Thus, Vcc'≅Vcc+$V_T$.

When control signal SELB is at a logic low, inverter 62 may provide a logic high input to the gate of n-type IGFET 63. Thus, n-type IGFET 63 may be turned on. N-type IGFET 63 may provide a potential drop of approximately its threshold voltage $V_T$ and may precharge data signal line 9 to approximately Vcc.

It is noted that inverter 62 may be a voltage conversion circuit such that it may receive a select signal SELB operating within one potential range (Vcc to ground) and may provide an output that may have another potential range (Vcc' to ground), as just one example. Alternatively, select signal SELB may have a logic high of Vcc' and a logic low of the ground potential and inverter 62 may have a power terminal receiving power supply potential Vcc', as just one example.

When control signal SELB is logic high, inverter 62 may provide a logic low input to the gate of n-type IGFET 63. Thus, n-type IGFET 63 may be turned off. In this way, precharge circuit 61 may be disabled and data signal line 9 may be electrically isolated from power supply terminal 64.

The operation of output buffer circuit 600 may be similar to the operation of output buffer circuit 300 in FIG. 3. The control gate of n-type IGFET 18 may be driven by an inverter 17. Inverter 17 may have a faster pull-up time than NOR gate 213 illustrated in conventional output buffer circuit 200 of FIG. 1. Inverter 17 may receive data signal line 9. Data signal line 9 may be used as a signal line through which data input signal DATAIN is supplied to buffer 3. However, data signal line 9 may also contain information from select signal SELB by way of precharge circuit 61. In this way, data signal line 9 may operate to provide data when select signal SELB is in a buffer enable state (logic high), but may provide a disable signal through precharge circuit 61, when select signal SELB is in a buffer disable state (logic low). Data signal line 9 may serve to turn off n-type IGFET 18 when select signal SELB is in a buffer disable state.

In this way, by eliminating the two input logic gate (NOR 213) of conventional output buffer circuit 200 (FIG. 1), by using a single input logic gate (inverter 17), the operation of output buffer circuit 600 may have an increased operating speed.

By using an n-type IGFET 63 to precharge data signal line 9, precharge circuit 61 may be provided in an area where only an N-type IGFET may be formed. This may add flexibility to the layout and chip area may be more efficiently used.

Raised power supply potential Vcc' may not be approximately equal to Vcc+$V_T$. It may only be necessary to precharge data signal line to a high enough potential to be detected as a logic high signal by buffer 3. Vcc' may be any power supply potential that may provide the desired precharge condition. However, it may be desirable for Vcc' to be a raised potential higher than power supply potential Vcc and further may be desirable to be approximately equal to Vcc+$V_T$.

Figure 7:
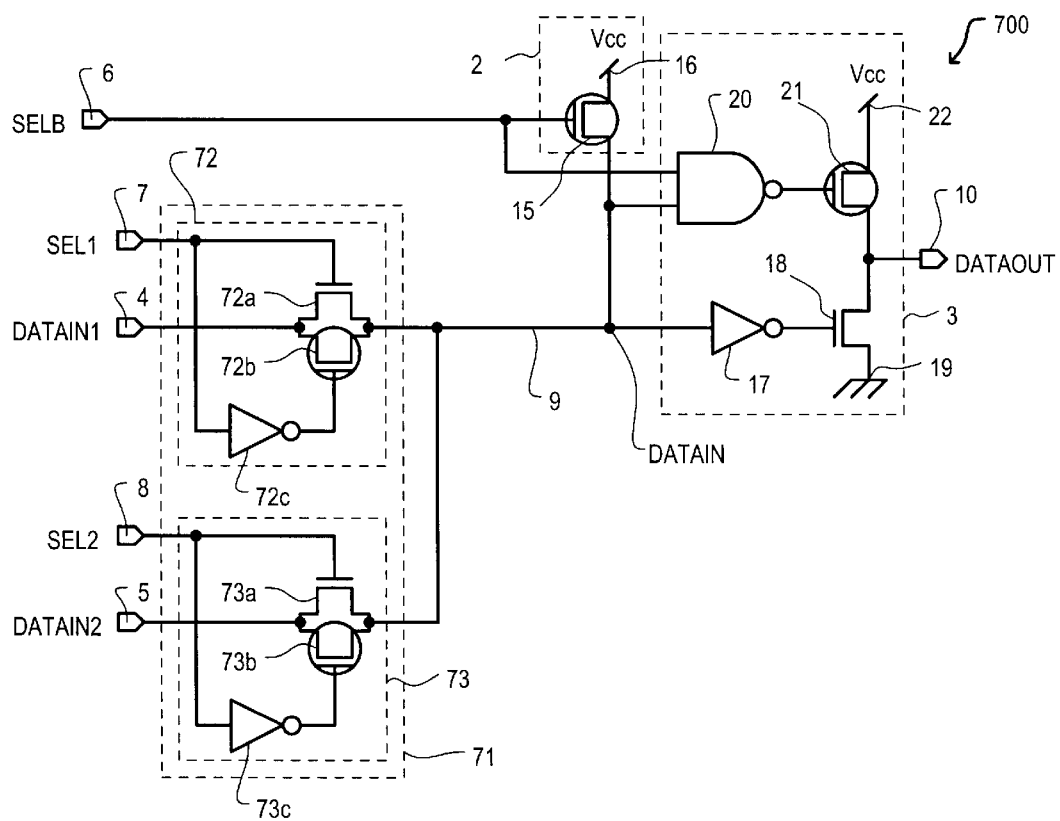
FIG. 7 is a circuit schematic diagram of an output buffer circuit according to one embodiment.

Referring now to FIG. 7, a circuit diagram of an output buffer circuit according to another embodiment is set forth and given the general reference character 700.

Output buffer circuit 700 can include similar circuit elements as output buffer circuit 300 (FIG. 3), as such, these similar circuit elements may be indicated by the same reference character.

Output buffer circuit 700 may include a selector 71 that is different that selector 1 illustrated in the embodiment of FIG. 3.

Output buffer circuit 700 can include a selector 71, a precharge circuit 2, and a buffer 3.

Selector 71 may include transfer gates (72 and 73).

Transfer gate 72 may include an inverter 72c, n-type insulated gate field effect transistor (IGFET) 72a, and p-type IGFET 72b. Inverter 72c may receive select signal SEL1 as an input and may produce an output that may be received at a control gate of p-type IGFET 72b. N-type IGFET 72a may receive select signal SEL1 at a control gate. N-type IGFET 72a and p-type IGFET 72b may be connected in parallel to provide a controllable impedance path between data input terminal 4 and data signal line 9.

Transfer gate 73 may include an inverter 73c, n-type insulated gate field effect transistor (IGFET) 73a, and p-type IGFET 73b. Inverter 73c may receive select signal SEL2 as an input and may produce an output that may be received at a control gate of p-type IGFET 73b. N-type IGFET 73a may receive select signal SEL2 at a control gate. N-type IGFET 73a and p-type IGFET 73b may be connected in parallel to provide a controllable impedance path between data input terminal 5 and data signal line 9.

Precharge circuit 2 and buffer 3 of output buffer circuit 700 may have the similar construction and operation to precharge circuit 2 and buffer 3 illustrated in output buffer circuit 300 of FIG. 3.

Referring still to FIG. 7, the operation of output buffer circuit 700 will now be explained.

Selector 71 may receive data input signals (DATAIN1 and DATAIN2) and may have an output connected to data signal line 9. Select signals (SEL1 and SEL2) may select one of data input signals (DATAIN1 and DATAIN2) to be applied to data signal line 9 through selector 71. When select signal SEL1 is logic high, data input terminal 4 may be electrically connected with data signal line 9. When select signal SEL2 is logic high, data input terminal 5 may be electrically connected with data signal line 9. Also, it is noted that only one of select signals (SEL1 and SEL2) may be high at any one time. Selector 71 may be conceptualized as a multiplexer for multiplexing between different data input signals (DATAIN1 and DATAIN2).

Select signals (SEL1 and SEL2) may be prevented from transferring to a high logic level when control signal SELB is in a disable state (logic low). In this way, data input terminals (4 and 5) may be electrically disconnected from data signal line 9 when precharge circuit 2 precharges data signal line 9.

The operation of output buffer circuit 700 may be similar to the operation of output buffer circuit 300 in FIG. 3. The control gate of n-type IGFET 18 may be driven by an inverter 17. Inverter 17 may have a faster pull-up time than NOR gate 213 illustrated in conventional output buffer circuit 200 of FIG. 1. Inverter 17 may receive data signal line 9. Data signal line 9 may be used as a signal line through which data input signal DATAIN is supplied to buffer 3. However, data signal line 9 may also contain information from select signal SELB by way of precharge circuit 2. In this way, data signal line 9 may operate to provide data when select signal SELB is in a buffer enable state (logic high), but may provide a disable signal through precharge circuit 2, when select signal SELB is in a buffer disable state (logic low). Data signal line 9 may serve to turn off n-type IGFET 18 when select signal SELB is in a buffer disable state. When select signal SELB is in a buffer disable state, data output terminal 10 may be placed in a high impedance state.

Figure 8:
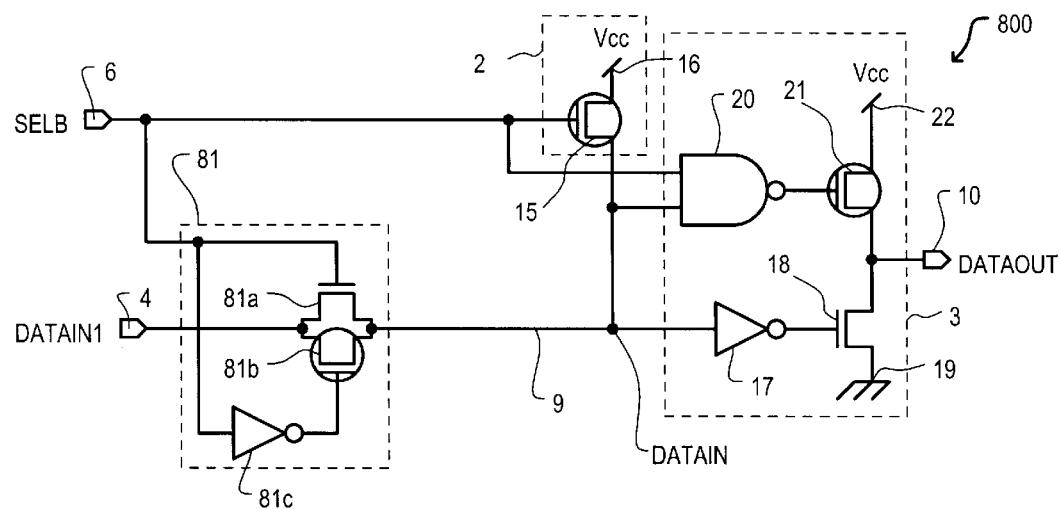
FIG. 8 is circuit schematic diagram of an output buffer circuit according to one embodiment.

Referring now to FIG. 8, a circuit diagram of an output buffer circuit according to another embodiment is set forth and given the general reference character 800.

Output buffer circuit 800 can include similar circuit elements as output buffer circuit 300 (FIG. 3), as such, these similar circuit elements may be indicated by the same reference character.

Output buffer circuit 800 may include a transfer gate 81, a precharge circuit 2, and a buffer 3.

Transfer gate 81 may include an inverter 81c, n-type insulated gate field effect transistor (IGFET) 81a, and p-type IGFET 81b. Inverter 81c may receive control signal SELB as an input and may produce an output that may be received at a control gate of p-type IGFET 81b. N-type IGFET 81a may receive control signal SELB at a control gate. N-type IGFET 81a and p-type IGFET 81b may be connected in parallel to provide a controllable impedance path between data input terminal 4 and data signal line 9.

Precharge circuit 2 and buffer 3 of output buffer circuit 800 may have the similar construction and operation to precharge circuit 2 and buffer 3 illustrated in output buffer circuit 300 of FIG. 3.

Transfer gate 81 may receive data input signal DATAIN1 and control signal SELB as inputs and may have an output connected to data signal line 9. When control signal SELB is logic high, data input terminal 4 may be electrically connected with data signal line 9. When control signal SELB is logic low, transfer gate 81 may be place in a high impedance state and data input terminal 4 may be electrically disconnected from data signal line 9. In this way, data input terminal 4 may be electrically disconnected from data signal line 9 when precharge circuit 2 precharges data signal line 9.

The operation of output buffer circuit 800 may be similar to the operation of output buffer circuit 300 in FIG. 3. The control gate of n-type IGFET 18 may be driven by an inverter 17. Inverter 17 may have a faster pull-up time than NOR gate 213 illustrated in conventional output buffer circuit 200 of FIG. 1. Inverter 17 may receive data signal line 9. Data signal line 9 may be used as a signal line through which data input signal DATAIN is supplied to buffer 3. However, data signal line 9 may also contain information from select signal SELB by way of precharge circuit 2. In this way, data signal line 9 may operate to provide data when select signal SELB is in a buffer enable state (logic high), but may provide a disable signal through precharge circuit 2, when select signal SELB is in a buffer disable state (logic low). Data signal line 9 may serve to turn off n-type IGFET 18 when select signal SELB is in a buffer disable state. When select signal SELB is in a buffer disable state, data output terminal 10 may be placed in a high impedance state.

It is understood that the embodiments described above are exemplary and the present invention should not be limited to those embodiments. Specific structures should not be limited to the described embodiments.

For example, although buffers (3 and 67) include complementary driver transistors (18–21 and 53–56), driver transistors may be of the same device type and logic corresponding logic may be modified, as just one example.

N-type IGFETs and p-type IGFETs may be metal-oxide-semiconductor (MOS) FETs, as just one example.

Although embodiments include transfer gates (for example transfer gates 12 and 14), a tri-stateable driver may be used, as just one example.

Thus, while the various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. An output buffer circuit, comprising:
   a control signal having a control signal enable state and a control signal disable state;
   a selector circuit enabled to output a data signal to a data signal line in response to the control signal having the control signal enable state and disabled to output the data signal to the data signal line in response to the control signal having the control signal disable state; and
   a precharge circuit precharging the data signal line to a first potential when the control signal is in the control signal disable state wherein
      the selector circuit is coupled to receive a plurality of data input signals and at least one select signal and selects one of the plurality of data input signals to output on the data signal line according to the at least one select signal.

2. The output buffer circuit according to claim 1, wherein the first potential is approximately equal to a power supply potential.

3. The output buffer circuit according to claim 1, wherein the selector circuit is coupled to receive a single data input signal and provides the data signal having a data signal logic value according to a logic value of the single data input signal on the data signal line in response to the control signal.

4. The output buffer circuit according to claim 1, wherein the precharge circuit comprises:
   a precharge IGFET providing a low impedance path between a power supply terminal and the data signal line in response to the control signal having the control signal disable state and a high impedance path between the power supply terminal and the data signal line in response to the control signal having the control signal enable state.

5. The output buffer circuit according to claim 4, wherein the precharge IGFET is a p-type IGFET and the power supply terminal receives a power supply potential that is approximately equal to the first potential.

6. The output buffer circuit according to claim 4, wherein the precharge IGFET is an n-type IGFET and the power supply terminal receives a power supply potential that is at least one n-type IGFET threshold voltage greater than the first potential.

7. An output buffer circuit, comprising:

a control signal having a first control signal state and a second control signal state;

a selector circuit enabled to provide a data signal to a data signal line in response to the control signal having the first control signal state and disabled to provide the data signal to the data signal line in response to the control signal having the second control signal state;

a precharge circuit precharging the data signal line to a first potential when the control signal is in the second control signal state; and a buffer coupled to receive the data signal from the data signal line and provide a data output signal on a data output terminal based on a logic value of the data signal when the control signal is in the first control signal state and provides a buffer disable state on the data output terminal when the control signal is in the second control signal state wherein the buffer further includes an n-type driver IGFET having a controllable impedance path coupled between a ground terminal and the data output terminal;

a p-type driver control IGFET having a first driver control IGFET terminal connected to a power supply terminal and a second driver control IGFET terminal connected to a control gate of the n-type driver IGFET, the p-type driver control IGFET has a control gate coupled to receive the data signal from the data signal line; and an inverter including the p-type driver control IGFET has an input coupled to receive the data signal from the data signal line and an output connected to the control gate of the n-type driver IGFET.

8. The output buffer circuit according to claim 7, wherein the buffer does not have data carrying signals driven through two series connected p-type IGFETs.

9. The output buffer circuit according to claim 7, wherein the buffer disable state is a high impedance state.

10. The output buffer circuit according to claim 7, wherein the buffer disable state is a first output logic state.

11. The output buffer circuit according to claim 10, wherein the first output logic state is a logic high state.

12. An output buffer circuit, comprising:

a control signal having a first control signal state and a second control signal state;

a selector circuit coupled to at least one data input terminal and a data signal line and enabled to provide a data signal to the data signal line in response to the control signal having the first control signal state and disabled to provide the data signal to the data signal line in response to the control signal having the second control signal state, the selector circuit provides a low impedance path between a first data input terminal of the at least one data input terminal and the data signal line when the control signal has the first control signal state and provides a high impedance path between all of the at least one data input terminals and the data signal line when the control signal has the second control signal state wherein the at least one data input terminal includes a second data input terminal and the selector includes a first pass gate providing a first controllable impedance path between the first data input terminal and the data signal line and a second pass providing a second controllable impedance path between the second data input terminal and the data signal line;

the selector circuit includes a first pass gate providing a first controllable impedance path between the first input terminal and the data signal line and a second pass providing a second controllable impedance path between the second input terminal and the data signal line a precharge circuit precharging the data signal line to a first potential when the control signal is in the second control signal state;

a buffer coupled to receive the data signal from the data signal line and provide a data output signal on a data output terminal based on a logic value of the data signal when the control signal is in the first control signal state and provides a buffer disable state on the data output terminal when the control signal is in the second control signal state;

wherein the buffer further includes a driver IGFET of a first conductivity type having a controllable impedance path coupled between a first power supply terminal and the data output terminal; and a driver control IGFET of a second conductivity type having a first driver control IGFET terminal connected to a second power supply terminal and a second driver control IGFET terminal connected to a control gate of the driver IGFET, the driver control IGFET has a control gate coupled to receive the data signal from the data signal line.

13. The output buffer circuit according to claim 12, wherein the selector further includes:

a first selector control circuit coupled to receive the control signal and a first select signal as inputs and provide a first selector control signal for controlling the first controllable impedance path; and a second selector control circuit coupled to receive the control signal and a second select signal as inputs and provide a second selector control signal for controlling the second controllable impedance path.

14. The output buffer circuit according to claim 13, wherein:

the first select signal has a first select signal enable state and a first select signal disable state and the second select signal has a second select signal enable state and a second select signal disable state;

the first select signal is in the first select signal disable state when the second select signal is in the second select signal enable state if the control signal is in the first control signal state; and the second select signal is in the second select signal disable state when the first select signal is in the first select signal enable state if the control signal is in the first control signal state.

15. The output buffer circuit according to claim 12, wherein first conductivity type is n-type and the second conductivity type is p-type.

* * * * *